(12) United States Patent
Comanzo et al.

(10) Patent No.: US 7,122,128 B2
(45) Date of Patent: Oct. 17, 2006

(54) PHOSPHORS CONTAINING BORATE OF TERBIUM, ALKALINE-EARTH, AND GROUP-3 METALS, AND LIGHT SOURCES INCORPORATING THE SAME

(75) Inventors: Holly Ann Comanzo, Niskayuna, NY (US); Venkatesan Manivannan, Rexford, NY (US); Alok Mani Srivastava, Niskayuna, NY (US); William Winder Beers, Chesterland, OH (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/834,142

(22) Filed: Apr. 29, 2004

(65) Prior Publication Data

US 2005/0242326 A1    Nov. 3, 2005

(51) Int. Cl.
  *C09K 11/63* (2006.01)
  *C09K 11/55* (2006.01)
  *H01J 29/20* (2006.01)
  *H01J 1/63* (2006.01)
  *H01J 63/06* (2006.01)
  *H01J 61/20* (2006.01)

(52) U.S. Cl. .............................. 252/301.4 R; 313/503; 313/468; 313/467; 313/486; 313/639; 257/98

(58) Field of Classification Search ......... 252/301.4 R; 313/467, 468, 486, 503, 639; 257/98, E33.061
See application file for complete search history.

(56) References Cited

U.S. PATENT DOCUMENTS 4,422,007 A * 12/1983 Fouassier et al. ........... 313/486
4,810,416 A * 3/1989 Hase et al. ............ 252/301.6 R
4,926,091 A * 5/1990 Verlijsdonk et al. ........ 313/486
4,946,621 A * 8/1990 Fouassier et al. ...... 252/301.4 R
5,132,043 A * 7/1992 Deboer ................ 252/301.4 R
6,090,310 A * 7/2000 Rao et al. ............. 252/301.4 R
6,736,994 B1 * 5/2004 Takeda et al. ........ 252/301.4 R

FOREIGN PATENT DOCUMENTS

| DE | 2410134 | * | 9/1974 |
| JP | 57-128776 | * | 8/1982 |
| JP | 62-1778 | * | 6/1987 |
| JP | 2004-107504 | * | 4/2004 |

OTHER PUBLICATIONS

"Phosphor Handbook", Shiego Shionoya et al. (ed), CRC Press, Boca Raton, Florida pp. 389-432 (1999).

* cited by examiner

Primary Examiner—C. Melissa Koslow
(74) Attorney, Agent, or Firm—Jason K. Klindtworth; William E. Powell, III

(57) ABSTRACT

A phosphor comprises a borate of terbium, at least an alkaline-earth metal, and at least a Group-3 metal. In one embodiment, the phosphor has a formula of $A_3(D_{1-x}Tb_x)_3(BO_3)_5$; wherein A is at least an alkaline-earth metal selected from the group consisting of calcium, barium, strontium, and magnesium; D is at least a Group-3 metal selected from the group consisting of lanthanum, scandium, and yttrium; and $0<x<0.5$. The phosphor can be used in light sources such as those based on mercury discharge or light-emitting diodes and in displays.

19 Claims, 5 Drawing Sheets

PHOSPHORS CONTAINING BORATE OF TERBIUM, ALKALINE-EARTH, AND GROUP-3 METALS, AND LIGHT SOURCES INCORPORATING THE SAME

This invention was made with government support under Contract No. DE-FC26-99FT40632 awarded by DOE. The government may have certain rights to the invention.

BACKGROUND OF THE INVENTION

This invention relates photoluminescent materials (or phosphors) and lighting technology. In particular, this invention relates to phosphors containing borate of terbium, alkaline-earth, and Group-3 metals, and to light sources incorporating such.

A phosphor is a luminescent material that absorbs radiation energy in a portion of the electromagnetic spectrum and emits energy in another portion of the electromagnetic spectrum. Phosphors of one important class are crystalline inorganic compounds of high chemical purity and of controlled composition to which small quantities of other elements (called "activators") have been added to convert them into efficient fluorescent materials. With the right combination of activators and inorganic compounds, the color of the emission can be controlled. Most useful and well-known phosphors emit radiation in the visible portion of the electromagnetic spectrum in response to excitation by electromagnetic radiation outside the visible range. Well-known phosphors have been used in mercury vapor discharge lamps to convert ultraviolet ("UV") radiation emitted by the excited mercury vapor to visible light. Other phosphors are capable of emitting visible light upon being excited by electrons (used in cathode ray tubes) or X rays (for example, scintillators in X-ray detection systems).

Fluorescent lamps having high luminous output and color rendering indices ("CRI"), which are based on mercury discharge and used for illumination, typically include three phosphors that convert UV radiation of the mercury discharge into relatively narrow bands of blue, green, and red visible light, concentrated in the spectral regions where the human eye has the highest sensitivity (450, 540, and 610 nm). These fluorescent lamps are commonly called tricolor lamps. Although a CRI of about 85 would give a normal appearance to most objects, some typical colors will look unnatural under illumination with tricolor lamps. Therefore, for certain applications, still higher CRIs are very desirable. Effort has been expended to provide efficient green light-emitting phosphors. Traditional green light-emitting phosphors have been $LaPO_4:Ce^{3+},Tb^{3+}$ and $GdMgB_5O_{10}:Ce^{3+},Tb^{3+}$, which rely on a sensitization of $Ce^{3+}$ ions and a transfer of energy from Ce3+ ions to Tb3+ ions. A more recently available green light-emitting phosphor has been $(Ce,Tb)MgAl_{11}O_{19}$, which also operates on the same principle. Although $GdMgB_5O_{10}:Ce^{3+},Tb^{3+}$ uses lower amounts of cerium, $LaPO_4:Ce^{3+},Tb^{3+}$ and $(Ce,Tb)MgAl_{11}O_{19}$ require considerable amounts of cerium, which contribute to their manufacturing costs. In addition, these phosphors still exhibit some undesirable UV emission from the cerium ions. Therefore, there is a continued need for efficient green light-emitting phosphors that do not emit UV radiation. It is also desirable to provide green light-emitting phosphors that use smaller amounts of expensive materials. It is also very desirable to use such novel phosphors to produce light sources having high energy efficiency and high CRIs.

SUMMARY OF THE INVENTION

The present invention provides phosphors that comprise a borate of terbium, at least an alkaline-earth metal, and at least a Group-3 metal.

According to one aspect of the present invention, the phosphor has a formula of $A_3(D_{1-x},Tb_x)_3(BO_3)_5$; wherein A is at least an alkaline-earth metal selected from the group consisting of calcium, barium, strontium, and magnesium; D is at least an element selected from the group consisting of Group-3 metals; and $0<x<0.5$.

According to another aspect of the present invention, A is calcium.

According to still another aspect of the present invention, D is lanthanum.

According to still another aspect of the present invention, a portion of terbium is substituted by another rare-earth metal to tune the peak emission of the phosphor.

According to yet another aspect, the present invention provides a method for making a phosphor that comprises a borate of terbium, at least an alkaline-earth metal, and at least a Group-3 metal. The method comprises: (a) mixing oxygen-containing compounds of: (1) boron; (2) terbium; (3) at least an alkaline-earth metal; and (4) at least a Group-3 metal; and (b) firing the mixture in an oxygen-containing atmosphere at a temperature in a range from about 1000° C. to about 1400° C. for a time sufficient to convert the mixture to the phosphor.

According to another aspect, a method for making a phosphor comprises: (a) providing a first solution that comprises compounds of: (1) boron; (2) terbium; (3) at least an alkaline-earth metal; and (4) at least a Group-3 metal; (b) combining the first solution and a second solution, the second solution comprising at least a compound selected from the group consisting of ammonium hydroxide; hydroxides of at least one element selected from the group consisting of terbium, said at least an alkaline-earth metal, and said at least a Group-3 metal; organic esters; organic dicarboxylic acids; and organic amines to produce a precipitate; (c) heating the precipitate in an oxygen-containing atmosphere at a temperature in a range from about 700° C. to about 1300° C. for a time sufficient to convert the precipitate to an oxygen-containing material that comprises boron, terbium, said at least an alkaline-earth metal, and said at least a Group-3 metal; and (d) firing said oxygen-containing material in an oxygen-containing atmosphere at a temperature in a range from about 1000° C. to about 1400° C. for a time sufficient to convert said oxygen-containing material to the phosphor.

According to still another aspect of the present invention, a method for making a phosphor comprises: (a) providing a first solution that comprises compounds of: (1) terbium; (2) at least an alkaline-earth metal; and (3) at least a Group-3 metal; (b) combining the first solution and a second solution, the second solution comprising at least a compound selected from the group consisting of ammonium hydroxide; hydroxides of at least one element selected from the group consisting of terbium, said at least an alkaline-earth metal, and said at least a Group-3 metal; organic esters; organic dicarboxylic acids; phosphoric acid: and organic amines to produce a precipitate; (c) heating the precipitate in an oxygen-containing atmosphere at a temperature in a range from about 700° C. to about 1300° C. for a time sufficient to convert the precipitate to an oxygen-containing material chat comprises terbium, said at least an alkaline-earth metal, and said at least a Group-3 metal; (d) combining said oxygen-containing material with at least an oxygen-containing compound of boron to produce a mixture; and (e) firing said mixture in an oxygen-containing atmosphere at a temperature in a range from about 1000° C. to about 1400° C. for a time sufficient to convert said mixture to the phosphor.

According to still another aspect, a visible light source comprises: (a) a source of radiation emitting radiation having wavelength in a range from about 250 nm to about 420 nm; and (b) a phosphor comprising a borate of: (1) terbium; (2) at least an alkaline-earth metal; and (3) at least a Group-3 metal; wherein the phosphor absorbs at least a portion of said radiation and emits visible light.

Other features and advantages of the present invention will be apparent from a perusal of the following detailed description of the invention and the accompanying drawings in which the same numerals refer to like elements.

Figure 1:
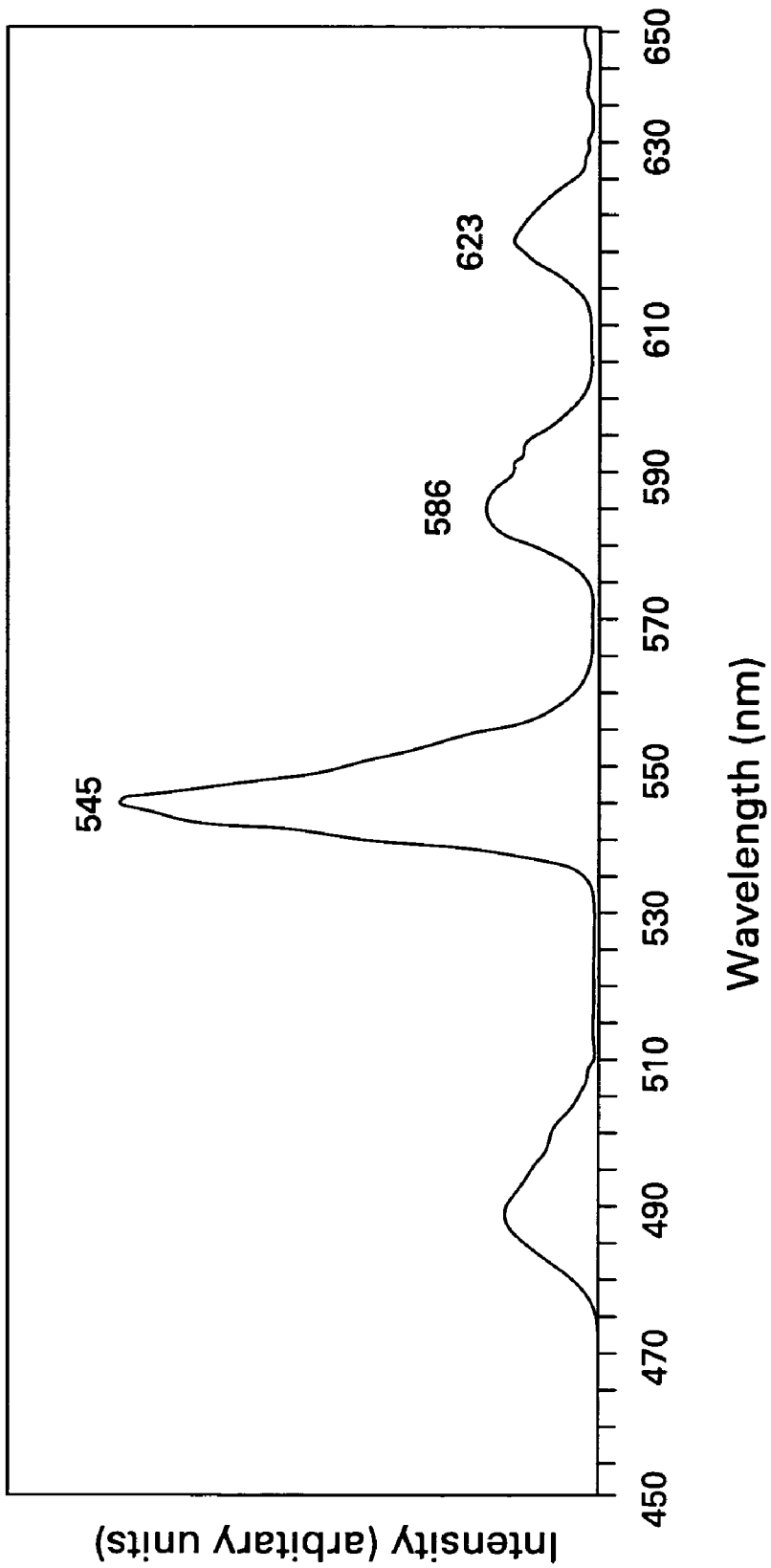
FIG. 1 shows the emission spectrum of the $Ca_3(La_{0.8}Tb_{0.2})_3(BO_3)_5$ phosphor of the present invention.

It should be understood that the drawings are included only for illustration purposes, are not intended to limit the invention in any way, and are not drawn to scale.

DETAILED DESCRIPTION OF THE INVENTION

In general, the present invention provides phosphors that comprise borates of terbium, at least an alkaline-earth metal, and at least a Group-3 metal. The phosphors of the present invention are excitable by radiation in the having wavelength in the range from about 250 nm to about 420 nm to emit substantially in visible light wavelengths from about 470 nm to about 650 nm, with a main emission in the green light spectrum.

In an embodiment of the present invention, the main emission is in the wavelength range from about 530 nm to about 570 nm.

According to one aspect of the present invention, the phosphor has a formula of $A_3(D_{1-x}Tb_x)_3(BO_3)_5$; wherein A is at least an alkaline-earth metal selected from the group consisting of calcium, barium, strontium, and magnesium; D is at least an element selected from the group consisting of Group-3 metals; and $0<x<0.5$.

According to another aspect of the present invention, A is calcium.

According to another aspect of the present invention, A is a combination of calcium and another alkaline-earth metal selected from the group consisting of barium, strontium, and magnesium.

According to still another aspect of the present invention, D is lanthanum.

According to still another aspect of the present invention, D is a combination of lanthanum and another Group-3 metal selected from the group consisting of scandium and yttrium.

According to still another aspect of the present invention, x is in the range from about 0.05 to about 0.3, preferably from about 0.1 to about 0.3, and more preferably from about 0.1 to about 0.25.

According to still another aspect of the present invention, a portion of terbium is substituted by another rare-earth metal to tune the wavelength of the peak emission of the phosphor. For example, it may be desirable to substitute a portion of terbium with gadolinium to shift the wavelength of the peak emission toward longer wavelengths.

According to one aspect of the present invention, the phosphor has a formula $Ca_3(La_{0.8}Tb_{0.2})_3(BO_3)_5$.

The present invention also provides methods for making a phosphor that comprises a borate of: (a) terbium; (b) at least an alkaline-earth metal; and (c) at least a Group-3 metal. A phosphor of the present invention can be produced by a dry method or a wet method. The dry method comprises: (a) mixing oxygen-containing compounds of: (1) boron; (2) terbium; (3) said at least an alkaline-earth metal; and (4) said at least a Group-3 metal to form a mixture; and (b) firing the mixture in an oxygen-containing atmosphere at a temperature in a range from about 1000° C. to about 1400° C. for a time sufficient to convert the mixture to the phosphor.

The oxygen-containing compounds may be mixed together by any mechanical method including, but not limited to, stirring or blending in a high-speed blender or a ribbon blender. The oxygen-containing compounds may be combined and pulverized together in a bowl mill, a hammer mill, or a jet mill. The mixing may be carried out by wet milling especially when the mixture of the oxygen-containing compounds is to be made into a solution for subsequent precipitation. If the mixture is wet, it may be dried first before being fired to a temperature in the range from about 1000° C. to about 1400° C. The drying may be carried out at ambient atmosphere or under a vacuum. The firing may be conducted in a batchwise or continuous process, preferably with a stirring or mixing action to promote good gas-solid contact. A firing time in a range from about 1 minute to about 10 hours is adequate. It should be noted that the firing time can depend on the amount of material being treated to produce the phosphor, or on the extent of contact between the solid and the gas of the atmosphere, or on the degree of mixing while the mixture is fired or heated. Preferably, the temperature is in the range from about 1000° C. to about 1400° C.

The mixture can be rapidly brought to and held at the final temperature. Alternatively, the mixture may be heated up to the final temperature at a lower rate, such as from about 10° C./minute to about 200° C./minute, preferably from about 10° C./minute to about 100° C./minute.

An oxygen-containing atmosphere suitable for the method of manufacture of the present invention comprises an oxygen-containing gas, such as oxygen, air, carbon monoxide, carbon dioxide, water, $NO_x$, $SO_x$, or a mixture of one of these compounds with an inert gas selected from the group consisting of nitrogen, helium, argon, krypton, xenon, and combinations thereof. A preferred oxygen-containing gas is a mixture of water vapor and nitrogen. Alternatively, the oxygen-containing gas mixture comprises water vapor, nitrogen, and gas generated by a reaction between the residual oxygen in the reactor or firing chamber and carbon particles packed therein to scavenge this residual oxygen.

In a preferred embodiment, the mixture of starting materials for producing the phosphor also comprises a flux, such as boric acid, lithium tetraborate, lithium carbonate, hydrogen borate, alkali hydroborate, or a mixture thereof. The flux can comprise up to about 10 percent by weight of the total mixture.

According to another aspect of the present invention, the flux may comprise at least a halide compound of terbium, said alkaline-earth metal, or said Group-13 metal. In one embodiment, the halide compound is a fluoride. The halide compound acts as a flux during the firing step and can comprise up to about 10 percent by weight of the mixture. The flux also can be an alkali halide. When the flux is an alkali halide, it may be desirable to wash the phosphor after firing to remove the residual alkali compound.

The oxygen-containing compounds of terbium, said at least an alkaline-earth metal, and said at least a Group-3 metal may be selected from the group consisting of oxides, carbonates, nitrates, sulfates, phosphates, citrates, carboxylates (salts of carboxylic acids), and combinations thereof. Lower carboxylates (e.g., having from one to five carbon atoms, inclusive), such as acetates, may be desirable.

According to another aspect, a method for making a phosphor comprises: (a) providing a first solution that comprises compounds of: (1) boron; (2) terbium; (3) at least an alkaline-earth metal; and (4) at least a Group-3 metal; (b) combining the first solution and a second solution, the second solution comprising at least a compound selected from the group consisting of ammonium hydroxide; hydroxides of at least one element selected from the group consisting of terbium, said at least an alkaline-earth metal, and said at least a Group-3 metal; organic esters; organic dicarboxylic acids; and organic amines to produce a precipitate; (c) heating the precipitate in an oxygen-containing atmosphere at a temperature in a range from about 700° C. to about 1300° C. for a time sufficient to convert the precipitate to an oxygen-containing material that comprises terbium, said at least an alkaline-earth metal, and said at least a Group-3 metal; and (d) firing said oxygen-containing material in a reducing atmosphere at a temperature in a range from about 1000° C. to about 1400° C. for a time sufficient to convert said oxygen-containing material to the phosphor.

In one embodiment, the first solution is simply an aqueous solution if the compounds of boron, terbium, said at least an alkaline-earth metal, and said at least a Group-3 metal are readily dissolved in water.

In another embodiment, oxides or other oxygen-containing compounds of boron, terbium, said at least an alkaline-earth metal, and said at least a Group-3 metal are dissolved in an acidic solution to form the first solution, such as hydrochloric acid, nitric acid, sulfuric acid, citric acid, or acetic acid. The strength of the acid solution is chosen to rapidly dissolve the oxides or the oxygen-containing compounds, and the choice is within the skill of a person skilled in the art. The second solution (e.g., ammonium hydroxide) is then added in increments to the first solution while stirring to precipitate a mixture of oxygen-containing compounds of boron, terbium, said at least an alkaline-earth metal, and said at least a Group-3 metal. An organic base; such as methanolamine, ethanolamine, propanolamine, dimethanolamine, diethanolamine, dipropanolamine, trimethanolamine, triethanolamine, or tripropanolamine; may be used in place of ammonium hydroxide. Alternatively, an ester of an organic acid may be used to carry out the precipitation; such as methyl, ethyl, or propyl esters of acetic acid, propionic acid, butyric acid, oxalic acid, malonic acid, succinic acid, or glutaric acid; dimethyl, diethyl, dipropyl esters of oxalic acid, malonic acid, succinic acid, or glutaric acid. Alternatively, an organic acid selected from the group consisting of oxalic acid, malonic acid, succinic acid, and glutaric acid, may be used to produce the precipitate. The precipitate is filtered, washed with deionized water, and optionally dried. The dried precipitate is ball milled or otherwise thoroughly blended and then fired in said oxygen-containing atmosphere at a temperature in the range from about 1000° C. to about 1400° C., preferably from about 1200° C. to about 1400° C. Alternatively, the wet precipitate can be heated or fired first, and then ball milled or otherwise thoroughly blended afterward.

In one embodiment of the method of the present invention a flux is included in the first solution. A flux is selected from the group disclosed above in conjunction with the dry method.

The oxygen-containing atmosphere for the heating step (c) can be air; oxygen; water vapor; $NO_x$; $SO_x$; or a mixture of oxygen or water vapor and an inert gas selected from the group consisting of nitrogen, helium, argon, krypton, xenon, and combinations thereof. The oxygen-containing atmosphere can comprise a gas that decomposes to give an oxygen-containing compound at the heating temperature. The heating time for step (c) is in the range from about 1 minute to about 10 hours.

An oxygen-containing atmosphere suitable for the method of manufacture of the present invention comprises an oxygen-containing gas selected from the group consisting of oxygen, air, water vapor, carbon monoxide, carbon dioxide, and mixtures of one of these compounds with an inert gas selected from the group consisting of nitrogen, helium, argon, krypton, xenon, and combinations thereof. A preferred oxygen-containing gas is a mixture of water vapor and nitrogen, such as nitrogen saturated with water vapor at room temperature or a temperature in the range from room temperature to a maximum temperature of the firing step. A firing time in a range from about 1 minute to about 10 hours is adequate. It should be noted that the firing time can depend on the amount of material being treated to produce the phosphor, or on the extent of contact between the solid and the gas of the atmosphere, or on the degree of mixing while the mixture is fired.

According still another aspect of the present invention, a method for making a phosphor comprise: (a) providing a first solution that comprises at least one compound of at least one of phosphor elements selected from the group consisting of boron, terbium, at least an alkaline-earth metal, and at least a Group-3 metal; (b) combining the first solution with a second solution, the second solution comprising hydroxides of phosphor elements that are absent in the first solution to form a precipitate; (c) heating the precipitate in an oxygen-containing atmosphere at a temperature in a range from about 700° C. to about 1300° C. for a time sufficient to convert the precipitate to an oxygen-containing material that comprises boron, terbium, said at least an alkaline-earth metal, and said at least a Group-3 metal; and (d) firing said mixture in an oxygen-containing atmosphere at a temperature in a range from about 1000° C. to about 1400° C. for a time sufficient to convert said mixture to the phosphor.

According to still another aspect of the present invention, a method for making a phosphor comprises: (a) providing a first solution that comprises compounds of: (1) terbium; (2) at least an alkaline-earth metal; and (3) at least a Group-3 metal; (b) combining the first solution and a second solution, the second solution comprising at least a compound selected from the group consisting of ammonium hydroxide; hydroxides of at least one element selected from the group consisting of terbium and said at least an alkaline-earth metal; organic esters; organic dicarboxylic acids; phosphoric acid; and organic airlines to produce a precipitate; (c) heating the precipitate in an oxygen-containing atmosphere at a temperature in a range from about 700° C. to about 1300° C. for a time sufficient to convert the precipitate to an oxygen-containing material that comprises terbium and said at least an alkaline-earth metals; (d) combining said oxygen-containing material with at least an oxygen-containing compound of boron to form a mixture; and (e) firing said mixture in an oxygen-containing atmosphere at a temperature in a range from about 1000° C. to about 1400° C. for a time sufficient to convert said oxygen-containing material to the phosphor.

In one embodiment, the first solution is simply an aqueous solution if the compounds of terbium, said at least an alkaline-earth metal, and said Group-3 metal are readily dissolved in water.

In another embodiment, oxides or other oxygen-containing compounds of terbium, said at least an alkaline-earth metal, and said Group-3 metal are dissolved in an acidic solution to form the first solution, such as hydrochloric acid, nitric acid, sulfuric acid, citric acid, or acetic acid. The strength of the acid solution is chosen to rapidly dissolve the oxides or the oxygen-containing compounds, and the choice is within the skill of a person skilled in the art. The second solution (e.g., ammonium hydroxide) is then added in increments to the first solution while stirring to precipitate a mixture of oxygen-containing compounds of terbium, said at least an alkaline-earth metal, and said at least a Group-3 metal. An organic base; such as methanolamine, ethanolamine, propanolamine, dimethanolamine, diethanolamine, dipropanolamine, trimethanolamine, triethanolamine, or tripropanolamine; may be used in place of ammonium hydroxide. Alternatively, an ester of an organic acid may be used to carry out the precipitation; such as methyl, ethyl, or propyl esters of acetic acid, propionic acid, butyric acid, oxalic acid, malonic acid, succinic acid, or glutaric acid; dimethyl, diethyl, dipropyl esters of oxalic acid, malonic acid, succinic acid, or glutaric acid. Alternatively, an organic acid selected from the group consisting of oxalic acid, malonic acid, succinic acid, and glutaric acid, may be used in the second solution to produce the precipitate. The precipitate is filtered, washed with deionized water, and optionally dried. The dried precipitate may be ball milled or otherwise thoroughly blended before being combined with an oxygen-containing compound of boron, and then fired in said oxygen-containing atmosphere at a temperature in the range from about 1000° C. to about 1400° C., preferably from about 1200° C. to about 1400° C.

In one embodiment of the method of the present invention a flux is included in the first solution. A flux is selected from the group disclosed above in conjunction with the dry method.

EXAMPLE 1

Manufacture of the Phosphor $Ca_3(La_{0.8}Tb_{0.2})_3(BO_3)_5$

The following quantities of materials were blended thoroughly together in a roller mill for 4 hours, using ¼-inch and ½-inch balls of yttrium partially stabilized with zirconia to form a mixture:

| | |
|---|---|
| $CaCO_3$: | 3.562 g |
| $Tb_4O_7$: | 1.33 g |
| $H_3BO_3$: | 3.741 g |
| Lithium tetraborate (as a flux): | 0.06 g |

The mixture was fired in an alumina crucible at 1100° C. for 5 hours in an atmosphere comprising water vapor and nitrogen. The material was then cooled down to room temperature and milled such that 50 percent of the material has a size of about 6.39 micrometers or smaller. The emission spectrum of this material is shown in FIG. 1. Its quantum efficiency is 118 percent of that of a commercial $LaPO_4:Ce^{3+},Tb^{3+}$ phosphor.

Other phosphors of the present invention can be prepared by the same dry method or by the wet method disclosed above.

In addition, a portion of terbium may be desirably substituted with at least one other rare-earth metal to tune the peak-emission wavelength of the phosphor. For example, terbium may be partially substituted with gadolinium.

Figure 2:
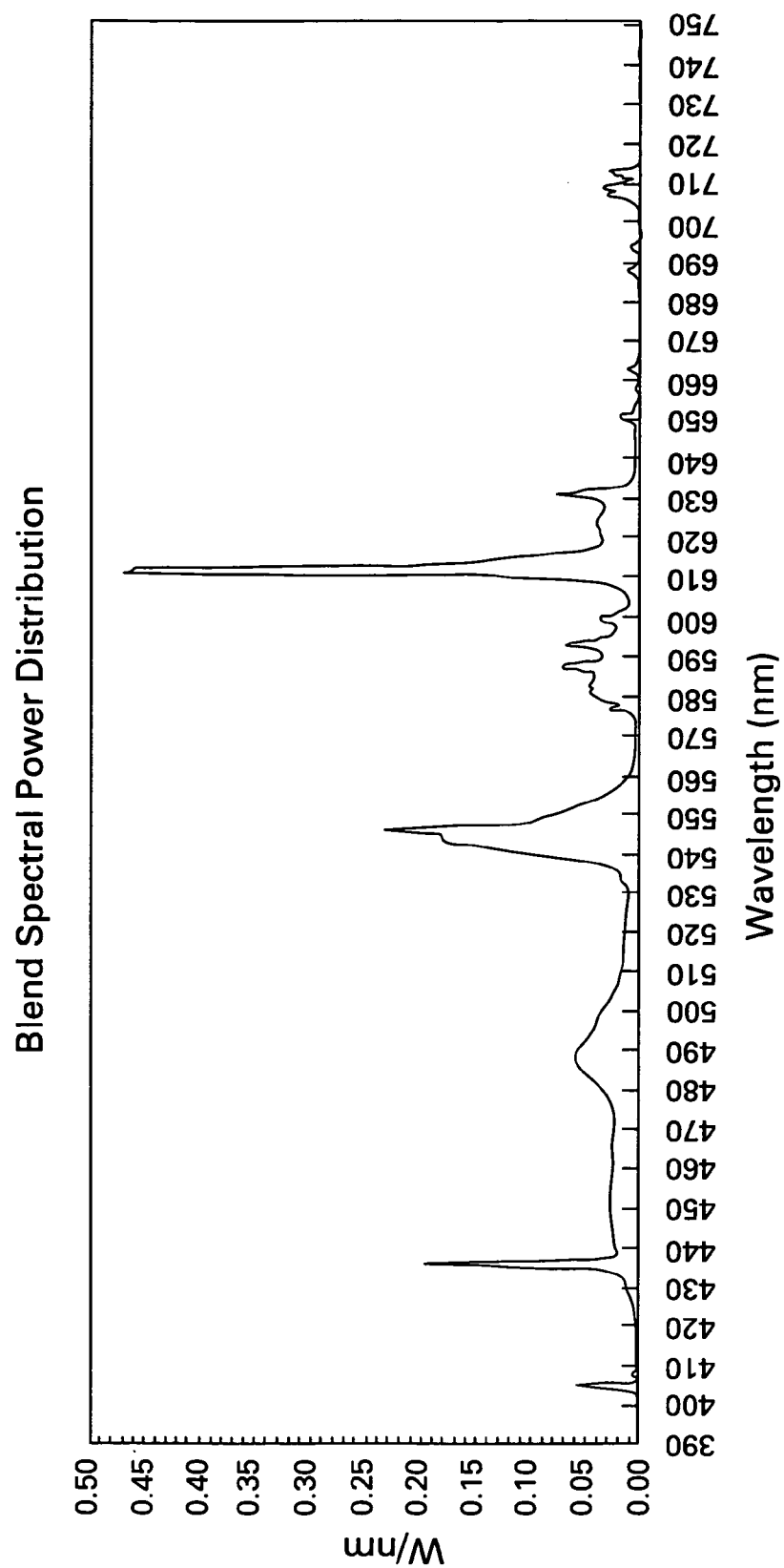
FIG. 2 shows the emission spectrum of a blend of the phosphor $Ca_3(La_{0.8}Tb_{0.2})_3(BO_3)_5$ of the present invention with $Y_2O_3:Eu^{3+}$, $Sr_5(PO4)_3(Cl,F,OH):Eu^{2+}$, $Sr_4Al_{14}O_{25}:Eu^{2+}$.

A phosphor of the present invention can be blended with other phosphors that emit blue, green, and red light to provide white light for a light source having a high CRI. For example, a phosphor of the present invention can be combined with a red light-emitting phosphor and a blue light-emitting phosphor; or a red light-emitting phosphor, a blue light-emitting phosphor, and a green light-emitting phosphor. For example, the phosphor $Ca_3(La_{0.8}Tb_{0.2})_3(BO_3)_5$ of the present invention can be blended with $Y_2O_3:Eu^{3+}$, $Sr_5(PO4)_3(Cl,F,OH):Eu^{2+}$, $Sr_4Al_{14}O_{25}:Eu^{2+}$ such that the emission contributions from these phosphors are 31.3%, 35%, 11.1%, and 17.7%, respectively. The emission spectrum of such a blend is shown in FIG. 2. This blend is projected to provide a CRI of 91.5, a luminosity of 77.7 lumens per watt, and a color coordinate of (0.38, 0.38).

White Light-Emitting Device

Incorporation of a blend of phosphors that comprises a green light-emitting phosphor of the present invention (as has been disclosed herein above), a red light-emitting phosphor, and a blue light-emitting phosphor in a mercury discharge device provides a white light-emitting device that have a higher efficiency than prior-art devices.

Another green light-emitting phosphor may be used in addition to a phosphor of the present invention, if desired. Non-limiting examples of such other green light-emitting phosphors are $GdMgB_5O_{10}:Ce^{3+},Tb^{3+}$; $CeMgAl^{11}O_{19}:Ce^{3+},Tb^{3+}$; $Ca_5(PO_4)_3(Cl,F,OH):Sb^{3+},Mn^{2+},Eu^{2+}$; $Sr_4Al_{14}O_{25}:Eu^{2+}$; and $BaAl_8O_{13}:Eu^{2+}$; and combinations thereof.

Non-limiting examples of blue light-emitting phosphors are $(Ba,Sr,Ca)_5(PO_4)_3(Cl,F,OH):Eu^{2+}$; $(Ba,Sr,Ca)MgAl_{10}O_{17}:Eu^{2+}$; $(Ba,Sr,Ca)BPO_5:Eu^{2+}$; and combinations thereof.

Non-limiting examples of other blue-green light-emitting phosphors are $BaAl_8O_{13}:Eu^{2+}$; $2SrO.0.84P_2O_5.0.16B_2O_3:Eu^{2+}$; $MgWO_4$; $BaTiP_2O_8$; $(Ba,Sr,Ca)MgAl_{10}O_{17}:Eu^{2+},Mn^{2+}$; $(Ba,Sr,Ca)_5(PO_4)_3(Cl,F,OH):Sb^{3+}$.

Non-limiting examples of red light-emitting phosphors are $(Y,Gd,La,Lu,Sc)_2O_3:Eu^{3+}$; $(Y,Gd,La,In,Lu,Sc)BO_3:Eu^{3+}$; $(Y,Gd,La)(Al,Ga)O_3:Eu^{3+}$; $(Ba,Sr,Ca)(Y,Gd,La,Lu)_2O_4:Eu^{3+}$; $(Y,Gd)Al_3B_4O_{12}:Eu^{3+}$; monoclinic $Gd_2O_3:Eu^{3+}$; $(Gd,Y)_4(Al,Ga)_2O_9:Eu^{3+}$; $(Ca,Sr)(Gd,Y)_3(Ge,Si)AlO_9:Eu^{3+}$; $(Sr,Mg)_3(PO_4)_{2+}$; $GdMgB_5O_{10}:Ce^{3+},Mn^{2+}$; and $3.5MgO.0.5MgF_2.GeO_2:Mn^{4+}$.

Green light-emitting phosphors used in a phosphor blend of the present invention preferably emit light having a peak emission in the range from about 530 nm to about 550 nm, to which the human eye is most sensitive. Blue light-emitting phosphors used in a phosphor blend of the present invention preferably emit light having a peak emission in the range from about 420 nm to about 500 nm. Red light-emitting phosphors preferably emit light having a peak emission in the wavelength range from about 600 nm to about 620 nm.

Figure 3:
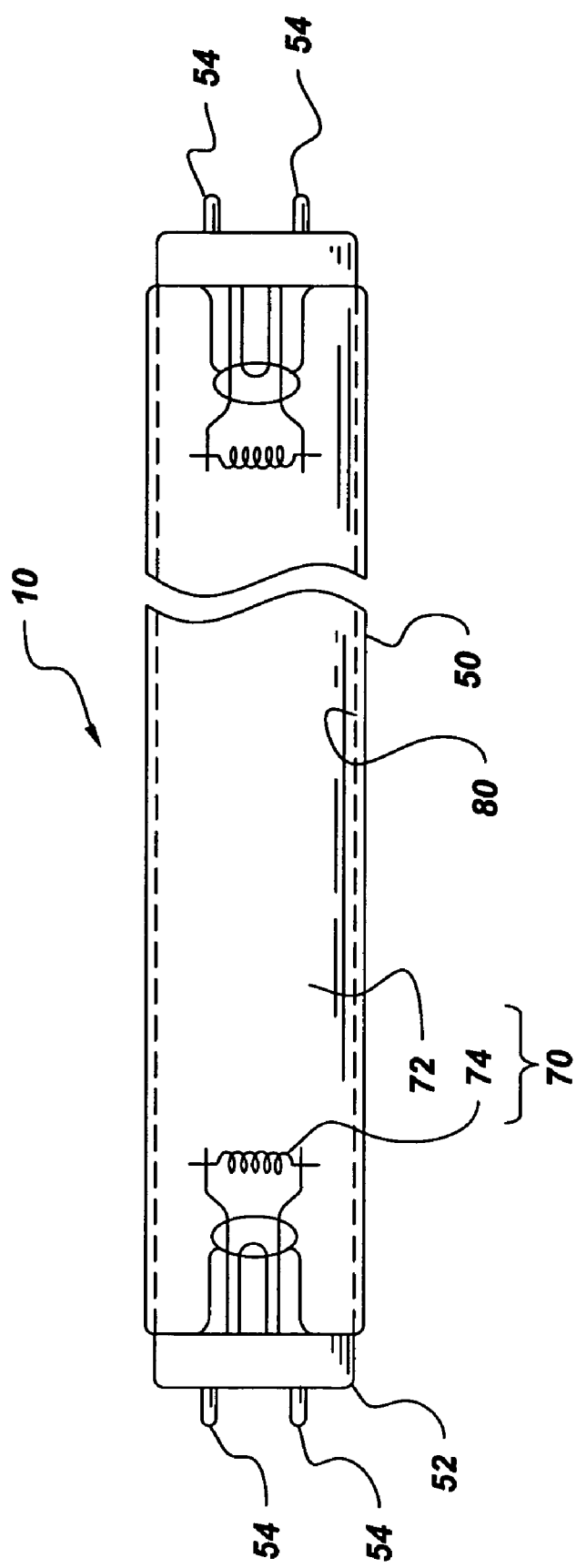
FIG. 3 shows schematically a light source that incorporates a phosphor of the present invention.

In one embodiment of the present invention, a light source 10, which produces white light with a high CRI suitable for general illumination (e.g., CRI in the range from about 85 to about 100), especially for special illumination purposes that require high CRIs, is shown in FIG. 3. Light source 10 comprises an evacuated sealed housing 50, a means 70 for generating UV radiation, which means is located within housing 50, and a phosphor blend 80 located within housing 50 and adapted to be excited by UV radiation. In one embodiment, light source 10 is a fluorescent lamp and evacuated housing 50 comprises an evacuated glass tube and associated end caps 52. In another embodiment, the phosphor blend is disposed on an inner surface of housing 50. Means 70 for generating UV radiation is a combination of a gas comprising a means 74 for generating high-energy electrons and a means 72 for absorbing the energy of the high-energy electrons. In one embodiment, means 72 for absorbing energy of high-energy electrons is a gas comprising mercury vapor, which absorbs energy of the high-energy electrons to create a mercury vapor discharge to excite the phosphor. In addition to mercury vapor, the gas can comprise an inert gas such as argon, krypton, or xenon. Means 74 for generating high-energy electrons may be a filament of a metal having a low work function (such as less than 4.5 eV), such as tungsten, or such a filament coated with alkaline earth metal oxides as are known in the art. Pins 54 are provided to supply electrical power to electron-generating means 74. The filament is coupled to a high-voltage source to generate electrons from the surface thereof. A phosphor of the present invention may be used in combination with other conventional phosphors used in fluorescent lighting technology. For example, a phosphor of the present invention may be combined with conventional red, green, and blue light-emitting phosphors, which conventional phosphor are disclosed herein above, to produce white light from a mercury discharge lamp. A particulate material comprising $TiO_2$ and/or $Al_2O_3$ can be used in conjunction with the phosphor blend to scatter light generated by light source 10. Such a light scattering material can be blended into the phosphor blend or disposed as a layer between the inner surface of housing 50 and phosphor layer 80. Although light source 10 shown in FIG. 3 comprises a straight housing 50, it should be understood that other housing shapes also are applicable. For example, a compact fluorescent lamp can have a housing that has one or more bends, and electrical supply pins 54 are disposed at one end of light source 10.

A green light-emitting phosphor of the present invention also can be used as a component of a phosphor blend for displays, such as cathode-ray tubes, which phosphor blend comprises blue, green, and red light-emitting phosphors. In this case, the high-energy electrons bombard a screen on which a coating of the phosphor blend is disposed to emit light in the visible spectral region.

Figure 4:
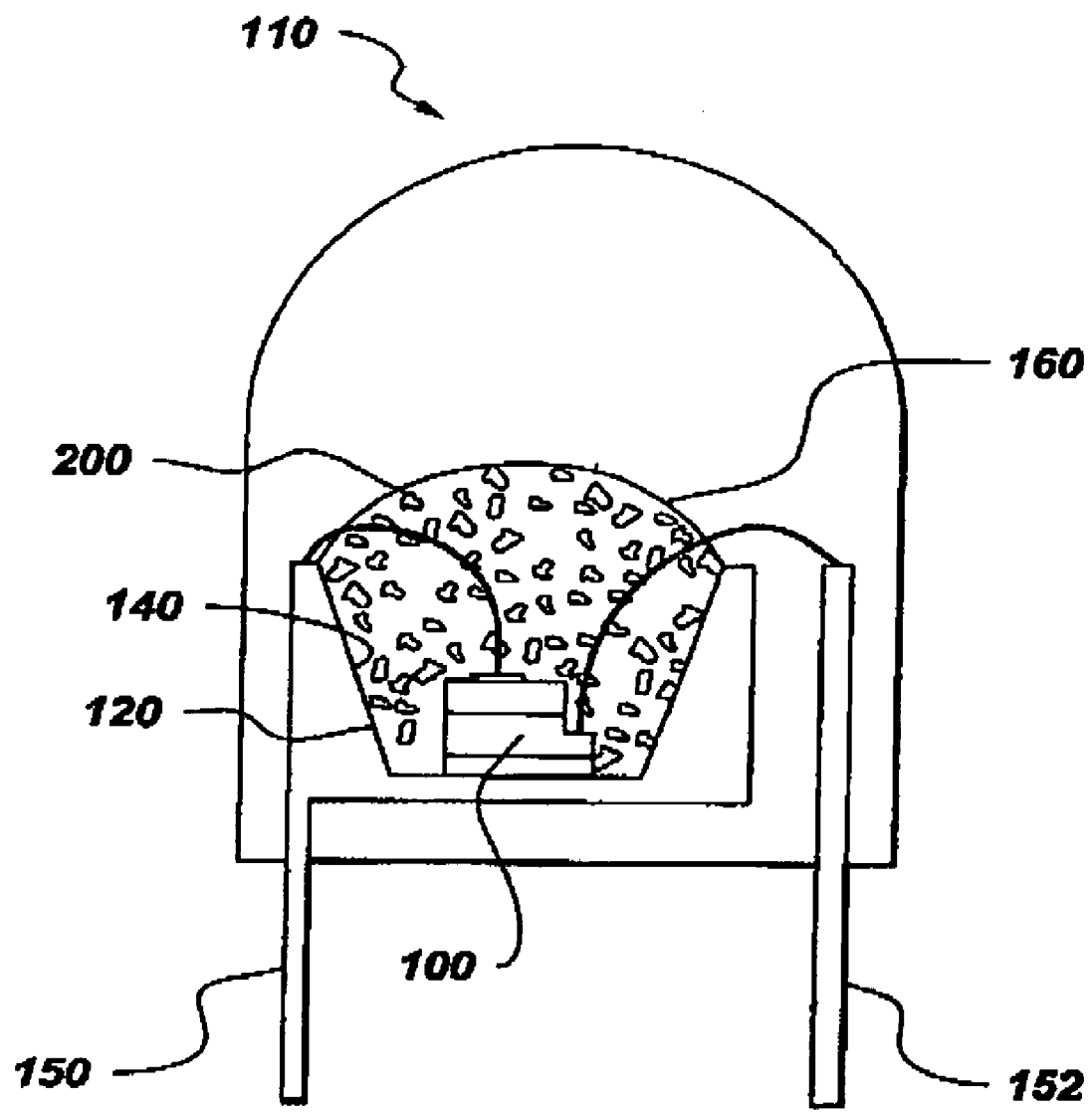
FIG. 4 shows schematically another light source that incorporates a phosphor of the present invention.

In another embodiment, a green light-emitting phosphor of the present invention also can be used to provide a visible light source based on a UV or UV-blue light emitting diode or laser diode (collectively refefred to as "LED" for convenience). Such green light-emitting phosphor may be used alone to provide a monochromatic light source or in a blend with other phosphors, such as blue and red light-emitting phosphors, to provide a light source emitting white light. The white source may be fabricated to provide a point source device by using one LED or a large-area lighting device by using a plurality of LEDs. For example, an LED-based light source 110 is shown in FIG. 4. Light source 110 comprises a LED 100 emitting UV or UV-blue light in the range of about 180 rim to about 480 nm and a phosphor of the present invention. The LED 100 is mounted in a cup 120 having a reflective surface 140 adjacent LED 100. Exemplary UV or UV-blue LEDs suitable as sources of radiation are those described in U.S. Pat. Nos. 5,777,350 and 6,210,987, which are incorporated herein by reference. Other UV-blue LEDs also may be used, such as LEDs based on GaN semiconductor doped with various metals to provide a large band gap. Electrical leads 150 and 152 are provided to supply electrical power to the LED 100. A transparent casting 160 comprising an epoxy, a silicone, or glass in which there are dispersed substantially uniformly particles 200 of a phosphor of the present invention. Alternatively, the phosphor particles may be applied on the LED 100 or dispersed in only a portion of the transparent casting 160. Other transparent polymers also may be used to form the transparent casting. In addition, particles of a light scattering material, such as TiO2 or Al2O3, may be included in the transparent casting among the phosphor particles to improve the uniformity of the light emitted from the light source 110. The composition of the InGaN active layer of the LED and the quantity of the phosphor applied in the casting may be chosen such that a portion of the blue light emitted by the LED that is not absorbed by the phosphor and the light emitted by the phosphor are combined to provide the white light source 110 of a desired color temperature and CRI.

Figure 5:
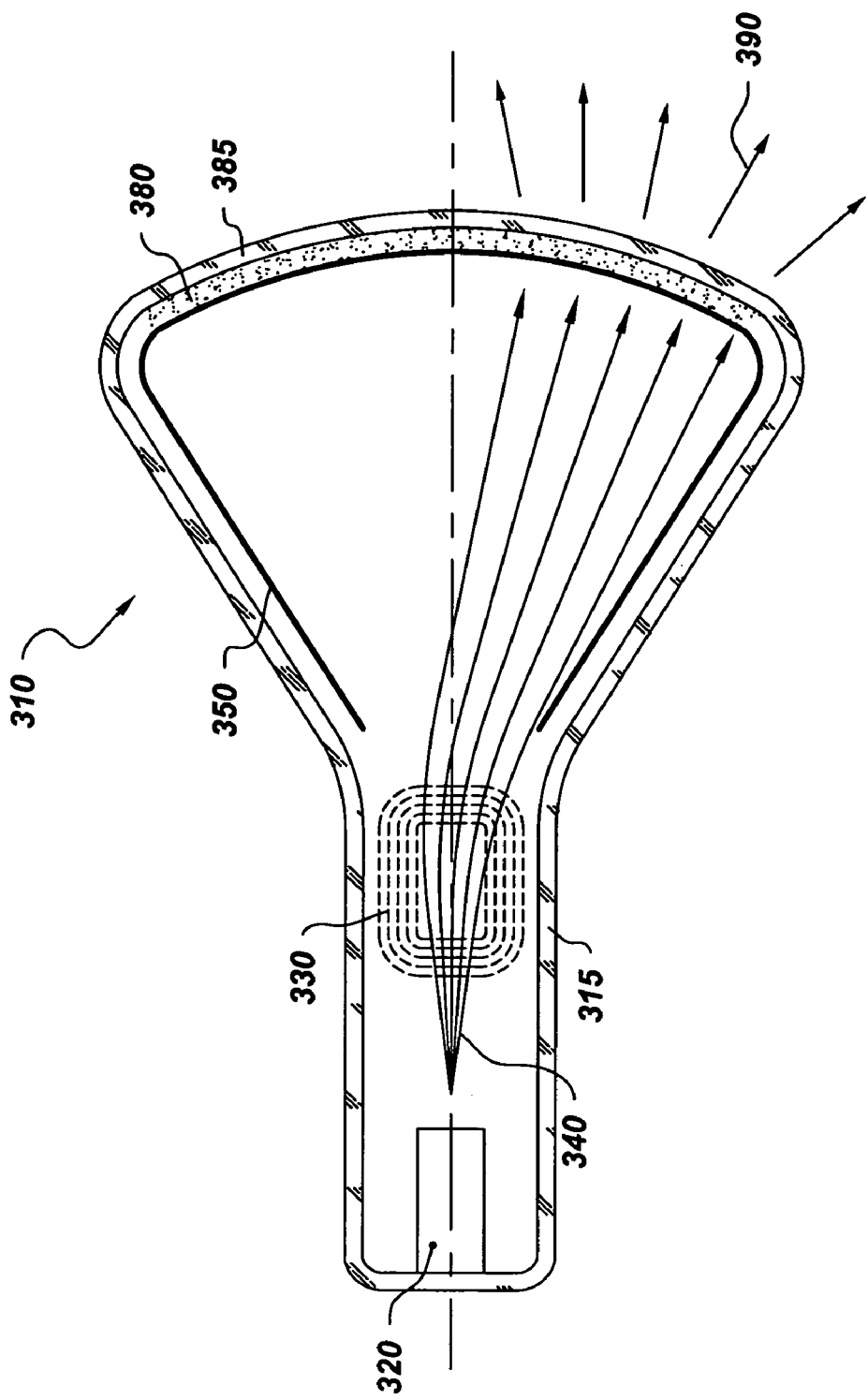
FIG. 5 shows schematically a display that incorporates a phosphor of the present invention.

A green light-emitting phosphor of the present invention also can be used as a component of a phosphor blend for displays, such as cathode-ray tubes, which phosphor blend comprises blue, green, and red light-emitting phosphors. In this case, the high-energy electrons bombard a screen on which a coating of the phosphor blend is disposed to emit light in the visible spectral region. For example, FIG. 5 shows schematically a display 310 that uses a phosphor of the present invention, singly or in combination with other phosphors. Display 310 comprises a sealed housing 315, wherein an electron gun 320 is located. Electron gun 320 produces a beam 340 of high-energy electrons, which is deflected by an electromagnetic field produced by system 330. Deflected electrons accelerate toward anode 350 and impinge on a phosphor layer 380, which is disposed on an internal surface of display screen 385 to excite the phosphor in layer 380 to produce visible light 390. Phosphor layer 380 comprises at least a phosphor of the present invention. Preferably, phosphor layer 380 also comprises other phosphors emitting other primary colors to provide a color display.

While specific preferred embodiments of the present invention have been described in the foregoing, it will be appreciated by those skilled in the art that many modifications, substitutions, or variations may be made thereto without departing from the spirit and scope of the invention as defined in the appended claims.

What is claimed is:

1. A phosphor comprising a formula of $A_3(D_{1-x}Tb_x)_3(BO_3)_5$; wherein A is at least an alkaline-earth metal selected from the group consisting of calcium, barium, strontium, and magnesium; D is at least a Group-3 metal selected from the group consisting of lanthanum, scandium, and yttrium; and $0<x<0.5$.

2. The phosphor according to claim 1, wherein A is calcium.

3. The phosphor according to claim 1, wherein D is lanthanum.

4. The phosphor according to claim 1, wherein x is in a range from about 0.05 to about 0.3.

5. The phosphor according to claim 1, wherein A is a combination of calcium and another alkaline-earth metal selected from the group consisting of barium, strontium, and magnesium.

6. The phosphor according to claim 1, wherein D is a combination of lanthanum and another Group-3 metal selected from the group consisting of scandium and yttrium.

7. A phosphor comprising a material having a formula of $Ca_3(La_{0.8}Tb_{0.2})_3(BO_3)_5$.

8. A phosphor blend comprising: (a) a phosphor having a formula $A_3(D_{1-x}Tb_x)_3(BO_3)_5$; wherein A is at least an alkaline-earth metal selected from the group consisting of calcium, barium, strontium, and magnesium; D is at least a Group-3 metal selected from the group consisting of lanthanum, scandium, and yttrium; and $0<x<0.5$; and (b) a red light-emitting phosphor.

9. The phosphor blend according to claim 8, further comprising a blue light-emitting phosphor.

10. The phosphor blend according to claim 9, further comprising a green light-emitting phosphor.

11. A method for making a phosphor having a formula $A_3(D_{1-x}Tb_x)_3(BO_3)_5$, wherein A is at least an alkaline-earth metal selected from the group consisting of calcium, barium, strontium, and magnesium, D is at least a Group-3 metal selected from the group consisting of lanthanum, scandium, and yttrium, and $0<x<0.5$, the method comprising:

mixing oxygen-containing compounds of: (1) boron; (2) terbium; (3) at least an alkaline-earth metal; (4) at least a Group-3 metal; and at least a material selected from the group consisting of lithium tetraborate, lithium carbonate, hydrogen borate, alkali hydroborate, and mixtures thereof to form a mixture; and firing the mixture in an oxygen-containing atmosphere at a temperature in a range from about 1100° C. to about 1400° C. for a time sufficient to convert the mixture to the phosphor.

12. A method for making a phosphor having a formula $A_3(D_{1-x}Tb_x)_3(BO_3)_5$, wherein A is at least an alkaline-earth metal selected from the group consisting of calcium, barium, strontium, and magnesium, D is at least a Group-3 metal selected from the group consisting of lanthanum, scandium, and yttrium, and $0<x<0.5$, the method comprising:

mixing oxygen-containing compounds of: (1) boron; (2) terbium; (3) at least an alkaline-earth metal; (4) at least a Group-3 metal; and at least a halide compound of an element selected from the group consisting of terbium, said alkaline-earth metal, said Group-3 metal, and combinations thereof to form a mixture; and firing the mixture in an oxygen-containing atmosphere at a temperature in a range from about 1100° C. to about 1400° C. for a time sufficient to convert the mixture to the phosphor.

13. A method for making a phosphor, the method comprising:

providing a first solution that comprises compounds of: (1) boron; (2) terbium; (3) at least an alkaline-earth metal; and (3) at least a Group-3 metal;

combining the first solution and a second solution, the second solution comprising at least a compound selected from the group consisting of ammonium hydroxide; hydroxides of at least one element selected from the group consisting of terbium, said at least an alkaline-earth metal, and said at least a Group-3 metal; organic esters; organic dicarboxylic acids; phosphoric acid; and organic amines to produce a precipitate;

heating the precipitate in an oxygen-containing atmosphere at a temperature in a range from about 700° C. to about 1300° C. for a time sufficient to convert the precipitate to an oxygen-containing material that comprises boron, terbium, said at least an alkaline-earth metal, and said at least a Group-3 metal; and firing said oxygen-containing material in an oxygen-containing atmosphere at a temperature in a range from about 1000° C. to about 1400° C. for a time sufficient to convert said oxygen-containing material to the phosphor the phosphor having the formula of $A_3(D_{1-x}Tb_x)_3(BO_3)_5$; wherein A is at least an alkaline-earth metal selected from the group consisting of calcium, barium, strontium, and magnesium; D is at least a Group-3 metal selected from the group consisting of lanthanum, scandium, and yttrium; and $0<x<0.5$.

14. A method for melting a phosphor having a formula $A_3(D_{1-x}Tb_x)_3(BO_3)_5$, wherein A is at least an alkaline-earth metal selected from the group consisting of calcium, barium, strontium, and magnesium, D is at least a Group-3 metal selected from the group consisting of lanthanum, scandium, and yttrium, and $0<x<0.5$, said method comprising:

providing a first solution that comprises compounds of: (1) terbium; (2) at least an alkaline-earth metal; and (3) at least a Group-3 metal;

combining the first solution and a second solution, the second solution comprising at least a compound selected from the group consisting of ammonium hydroxide; hydroxides of terbium, said at least an alkaline-earth metal; organic esters; organic dicarboxylic acids; and organic amines to produce a precipitate;

heating the precipitate in an oxygen-containing atmosphere at a temperature in a range from about 700° C. to about 1300° C. for a time sufficient to convert the precipitate to an oxygen-containing material that comprises terbium, said at least an alkaline-earth metal, and said at least a Group-3 metal;

combining said oxygen-containing material with at least an oxygen-containing compound of boron to form a mixture; and firing said mixture in an oxygen-containing atmosphere at a temperature in a range from about 1000° C. to about 1400° C. for a time sufficient to convert said mixture to the phosphor.

15. A light source comprising:

a source of radiation that is located in a housing; and a phosphor disposed in a path of said radiation and adapted to be excited by the radiation and to emit visible light; wherein the phosphor comprises a material having a formula of $A_3(D_{1-x}Tb_x)_3(BO_3)_5$; wherein A is at least an alkaline-earth metal selected from the group consisting of calcium, barium, strontium, and magnesium; D is at least a Group-3 metal selected from the group consisting of lanthanum, scandium, and yttrium; and $0<x<0.5$.

16. The light source according to claim 15; wherein said housing is a sealed housing, and said radiation is UV radiation.

17. The light source according to claim 15, wherein said radiation source is selected from the group consisting of UV light-emitting diodes, UV-blue light-emitting diodes, UV laser diodes, and UV-blue laser diodes.

18. The light source according to claim 15, wherein the source of radiation is a mercury gas discharge.

19. A display comprising:
a source of radiation that is located in a housing, said radiation comprising high-energy electrons; and
a phosphor disposed in a path of said radiation and adapted to be excited by the radiation and to emit visible light; wherein the phosphor comprises a material having a formula of $A_3(D_{1-x}Tb_x)_3(BO_3)_5$; wherein A is at least an alkaline-earth metal selected from the group consisting of calcium, barium, strontium, and magnesium; D is at least a Group-3 metal selected from the group consisting of lanthanum, scandium, and yttrium; and $0<x<0.5$.

* * * * *